(12) United States Patent
Perner et al.

(10) Patent No.: US 6,947,313 B2
(45) Date of Patent: Sep. 20, 2005

(54) METHOD AND APPARATUS OF COUPLING CONDUCTORS IN MAGNETIC MEMORY

(75) Inventors: Frederick A. Perner, Palo Alto, CA (US); Kenneth K. Smith, Boise, ID (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

(21) Appl. No.: 10/649,076

(22) Filed: Aug. 27, 2003

(65) Prior Publication Data

US 2005/0047199 A1 Mar. 3, 2005

(51) Int. Cl.$^7$ ................................................ G11C 11/00
(52) U.S. Cl. ....................... 365/158; 365/171; 365/173
(58) Field of Search ................................. 365/158, 171, 365/173; 710/303; 713/2, 202, 323

(56) References Cited

U.S. PATENT DOCUMENTS

| | | | | |
|---|---|---|---|---|
| 5,640,343 A | | 6/1997 | Gallagher et al. | |
| 6,065,122 A | * | 5/2000 | Wunderlich et al. | 713/323 |
| 6,145,029 A | * | 11/2000 | Deschepper et al. | 710/303 |
| 6,199,167 B1 | * | 3/2001 | Heinrich et al. | 713/202 |
| 6,292,890 B1 | * | 9/2001 | Crisan | 713/2 |
| 6,356,965 B1 | * | 3/2002 | Broyles et al. | 713/2 |
| 6,365,419 B1 | | 4/2002 | Durlam et al. | |
| 6,368,878 B1 | | 4/2002 | Abraham et al. | |
| 6,404,671 B1 | * | 6/2002 | Reohr et al. | 365/171 |
| 6,452,240 B1 | | 9/2002 | Ingvarsson et al. | |
| 6,462,980 B2 | * | 10/2002 | Schuster-Woldan et al. | 365/158 |
| 6,473,336 B1 | * | 10/2002 | Nakajima et al. | 365/171 |
| 6,490,190 B1 | * | 12/2002 | Ramcke et al. | 365/158 |
| 6,542,402 B2 | | 4/2003 | Hidaka | |
| 6,693,825 B1 | * | 2/2004 | Sharma et al. | 365/158 |
| 6,788,568 B2 | * | 9/2004 | Hidaka | 365/158 |
| 6,801,451 B2 | * | 10/2004 | Tran et al. | 365/158 |

* cited by examiner

Primary Examiner—Trong Phan

(57) ABSTRACT

Method and apparatus for coupling conductors in magnetic memory. In some embodiments, the memory element comprises: a first magnetic memory element, a first group of conductors magnetically coupled to the first magnetic memory element, a second magnetic memory element, a second group of conductors magnetically coupled to the second magnetic memory element, where the second magnetic memory element is substantially vertical to the first, and the first and second group of conductors have at least one conductor in common.

21 Claims, 4 Drawing Sheets

US 6,947,313 B2

METHOD AND APPARATUS OF COUPLING CONDUCTORS IN MAGNETIC MEMORY

BACKGROUND

Memory devices are ubiquitous in numerous fields involving computers and electronics. In some cases, memory has been implemented with storage elements capable of storing electrical charge. In other cases, memory has been implemented with storage elements capable storing magnetic orientation. Solid-state magnetic memory arrays may comprise individual storage elements constructed utilizing semiconductor processing techniques.

The individual magnetic elements of the magnetic memory array may comprise materials with varying magnetic properties separated by an insulating layer. The magnetizations of the separated materials may be oriented in the same direction (termed "parallel"), or their orientation may be opposite directions (termed "anti-parallel"). The electrical resistance of the magnetic elements may vary depending on the parallel or anti-parallel orientation of the magnetizations. In this manner, digital information may be stored and retrieved by associating digital values (e.g., 1s and 0s) to the electrical resistance associated with the parallel and anti-parallel states.

The orientation (i.e., parallel or anti-parallel), and consequently the digital value, of a memory element may be configured by inducing a magnetic field in the memory element. Conductors that may be proximate to the memory element may conduct current, and this current may consequently induce a magnetic field in the proximate memory element. The induced magnetic field may then change the orientation of the memory element.

Because memory is often employed in consumer electronics, memory that is high speed, low cost, and low power is desirable. The power consumption, speed, and cost of the memory chip are directly related to the total chip area (i.e., the area of the array of memory elements and accompanying circuitry), and larger chips may be more costly to manufacture. As a result, low cost memory may be built by densely packing memory elements within a memory array. However, the conductors used in configuring the memory elements may undesirably limit the density of the memory elements and add to the size of the chip.

Therefore, it may be difficult to design memory that is fast, cheap, and that consumes low power because the techniques for increasing speed and decreasing power often lead to cost increases and vice versa.

BRIEF SUMMARY

Methods and apparatuses are disclosed for coupling conductors in magnetic memory. In some embodiments, the memory element may comprise: a first magnetic memory element, a first group of conductors magnetically coupled to the first magnetic memory element, a second magnetic memory element, a second group of conductors magnetically coupled to the second magnetic memory element, where the second magnetic memory element is substantially vertical to the first, and the first and second group of conductors may have at least one conductor in common.

BRIEF DESCRIPTION OF THE DRAWINGS

For a detailed description of the various embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical or mechanical connection. Thus, if a first device couples to a second device, that connection may be through a direct connection, or through an indirect connection via other devices and connections. The phrase "magnetically coupled" is intended to refer to the situation in which a magnetic field emanating from a first material is induced in second material. For example, a conductor carrying a current may emanate a magnetic field that may be coupled into a magnetic material. Also, the term "easy axis" current refers to current that produces a magnetic field along the easy axis of a magnetic memory element. Likewise, the term "hard axis" current refers to a current that produces a magnetic field along the hard axis of a magnetic memory element.

DETAILED DESCRIPTION

The drawings and following discussion are directed to various embodiments of the invention. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure, is limited to that embodiment.

Figure 1:
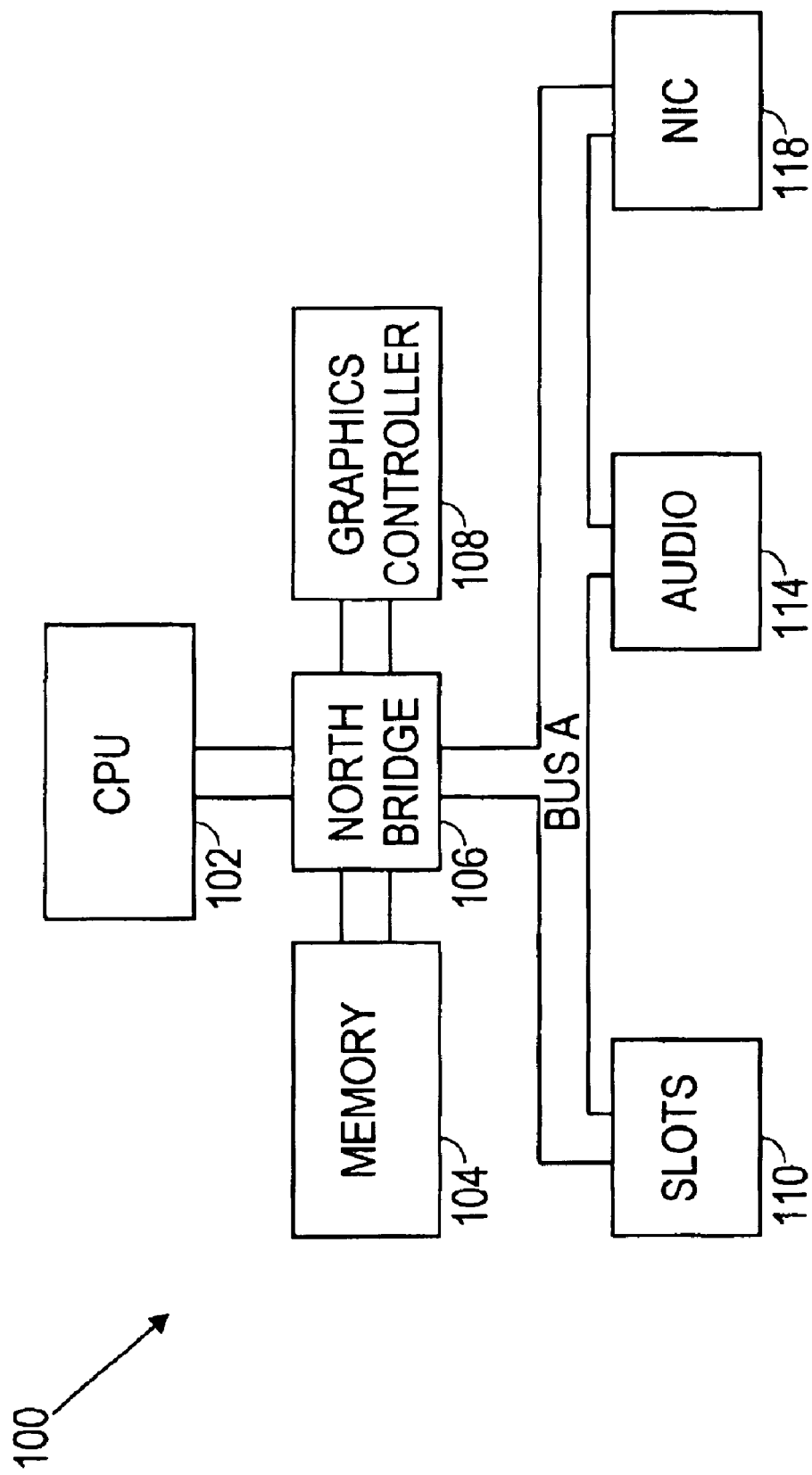
FIG. 1 illustrates an exemplary computer system in accordance with various embodiments of the invention.

The memory disclosed herein, and the methods for reducing memory power consumption, may be used in a computer system. FIG. 1 illustrates an exemplary computer system 100. The computer system of FIG. 1 includes a CPU 102 that may be electrically coupled to a bridge logic device 106 via a CPU bus. The bridge logic device 106 is sometimes referred to as a "North bridge." The North bridge 106 may electrically couple to a main memory array 104 by a memory bus, and may further electrically couple to a graphics controller 108 via an advanced graphics processor (AGP) bus. The North bridge 106 may couple CPU 102, memory 104, and graphics controller 108 to the other peripheral devices in the system through, for example, a primary expansion bus (BUS A) such as a PCI bus or an EISA bus. Various components that operate using the bus protocol of BUS A may reside on this bus, such as an audio device 114, and a network interface card (NIC) 118. These components may be integrated onto the motherboard, or they may be plugged into expansion slots 110 coupled to BUS A.

Figure 2A:
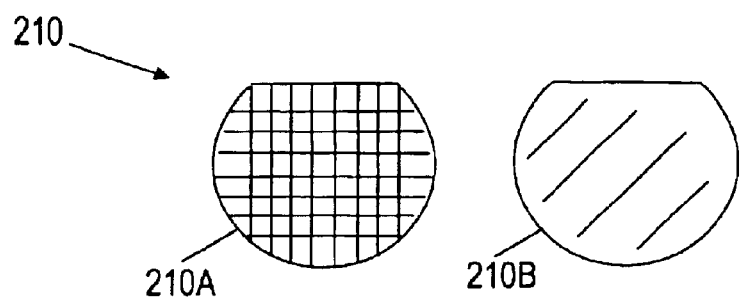
FIG. 2A illustrates a substrate in wafer form in accordance with various embodiments of the invention.
Figure 2B:
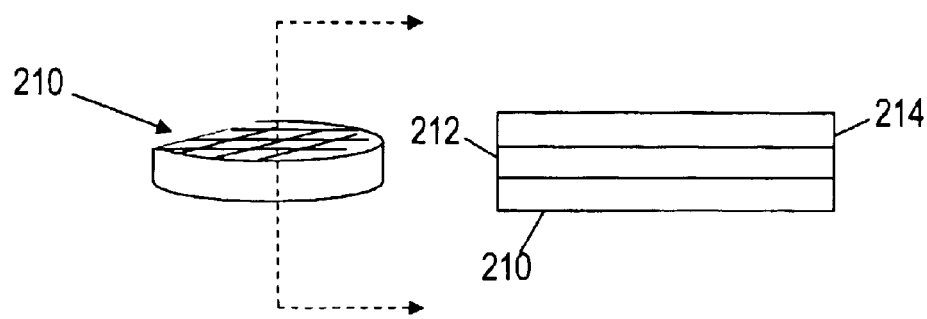
FIG. 2B illustrates a simplified cross-section of an integrated circuit containing magnetic memory in accordance with various embodiments of the invention.

The main memory array 104 may be manufactured using semiconductor processing techniques. FIG. 2A illustrates a semiconductor substrate 210 in wafer form. Substrate 210 may comprise silicon, germanium, gallium arsenide, or other elements that have semiconducting properties. Circuitry and memory elements may be integrated on side 210A of the substrate while opposite side 210B may remain substantially void. FIG. 2B illustrates a simplified cross section of substrate 210 including circuitry 212 and memory elements 214 integrated on the substrate 210. Circuitry 212 may comprise complementary metal oxide semiconductor (CMOS) type transistors. Other technologies (i.e., bipolar, JFET) may alternatively be used. Circuitry 212 may implement circuitry for writing and reading digital information to and from magnetic memory 214. Because different material and techniques may be used, circuitry 212 and memory 214 may be manufactured separately. For example in FIG. 2B, the transistors in circuitry 212 may be integrated on the integrated circuit prior to integrating the memory elements of memory 214.

Figure 3:
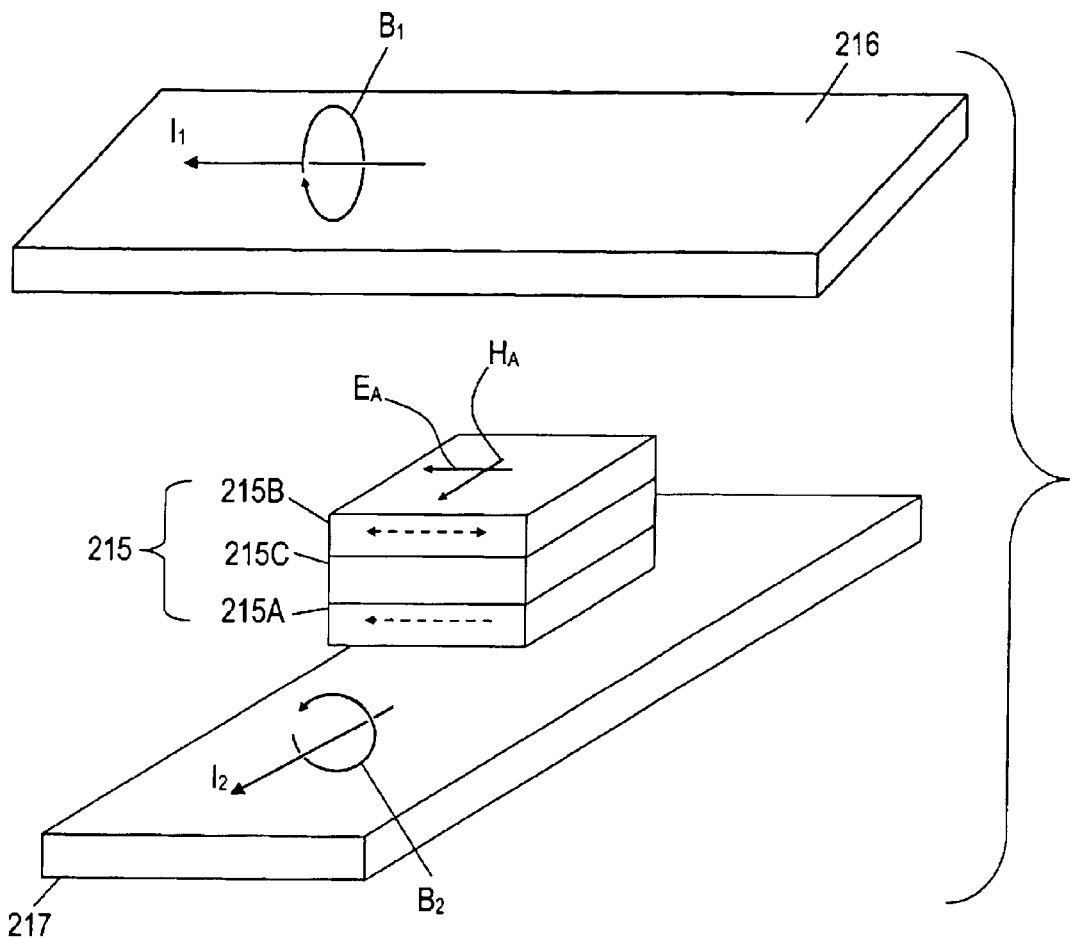
FIG. 3 illustrates an exemplary implementation of a magnetic memory element in accordance with embodiments of the invention.

Magnetic memory 214 may comprise memory elements, where information may be stored in the memory elements by altering their magnetic state. FIG. 3 illustrates an implementation of a memory element 215 and associated conductors 216 and 217 which may be used to write the memory element. Memory element 215 may comprise a reference layer 215A, which in some embodiments has a magnetization with fixed orientation (as illustrated by the single sided dashed arrow). In these embodiments, layer 215A may be referred to as the "pinned" layer because of its fixed orientation. Memory element 215 may also include another layer 215B, integrated on top of layer 215A, with an insulating layer 215C disposed between layers 215A and 215B. In this manner, layers 215A and 215B may form a sandwich-like structure around layer 215C. In some embodiments, layer 215B may have a magnetization with variable orientation (as illustrated by the double sided dashed arrow). By exposing the magnetic layer 215 to a magnetic field in a particular direction, the orientation of the magnetization in the magnetic layer 215B may be changed. Thus, layer 215B may be referred to as the "data" layer because it may store the orientation of the memory element 215 with respect to layer 215A, which may have fixed orientation.

The magnetic layers 215A and 215B of memory element 215 may be preconfigured to favor a particular axis for the orientation of magnetization. The favored orientation of magnetization is sometimes referred to as the "easy axis." For example, the easy axis of magnetic layer 215B is labeled $E_A$ in FIG. 3. Similarly the non-favored orientation of magnetization is sometimes referred to as the "hard axis." The hard axis of layer 215B, labeled $H_A$ in FIG. 3, may be orthogonal to the easy axis. The memory element 215 may be configured such that the magnetic fields required to change the magnetic orientation of a magnetic layer may be less along the easy axis than along the hard axis.

Figure 4A:
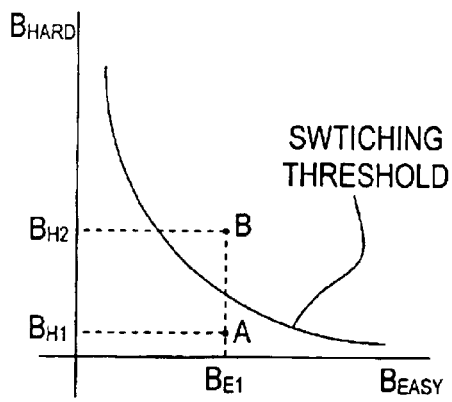
FIG. 4A illustrates an exemplary relationship between the axes of magnetic orientation of an exemplary memory element in accordance with embodiments of the invention.

FIG. 4A illustrates an exemplary relationship between the absolute value of magnetic fields along the easy axis ($B_E$) and the absolute value of magnetic fields along the hard axis ($B_H$) as they relate to changing of the magnetic orientation of the magnetic layer. The curve illustrated in FIG. 4A may represent the magnetic threshold at which a magnetization orientation of a magnetic layer (such as layer 215B in FIG. 3) may switch. A magnetic layer may be subject to a net magnetic field comprising a component in the easy axis $B_E$ direction, and a component in the hard axis direction $B_H$. When the magnetic layer experiences a net magnetic field that is above the magnetization threshold (illustrated in FIG. 4A), the magnetic orientation of the magnetic layer may be changed. Yet, beneath the magnetization threshold, the net magnetic field applied to the magnetic layer may not be enough to cause the orientation of the magnetic layer to change.

For example, the magnetization threshold illustrated in FIG. 4A may correspond to the magnetization characteristics of layer 215B illustrated in FIG. 3. Current in conductor 216 may induce a magnetic field aligned with the hard axis (indicated as $B_{H1}$ in FIG. 4A), and current in conductor 217 may induce a magnetic field aligned with the easy axis (indicated as $B_{E1}$). The dashed lines in FIG. 4A indicate that the magnetic field components $B_{E1}$ and $B_{H1}$ together may result in a net magnetic field at point A. Since the net magnetic field at point A is beneath the magnetization threshold, the net magnetic field may not be sufficient to cause the magnetic orientation of the magnetic layer to change. However, if the hard axis component is increased to $B_{H2}$ (as indicated by the dashed line) while the easy axis magnetic field is held constant at $B_{E1}$, then the net magnetic field at point B may be sufficient to cause the orientation of the magnetic layer to change. The relationship depicted in FIG. 4A is merely illustrative and other viable relationships may exist. For example, magnetic layers may be fabricated with an inherent alteration in the magnetization threshold in either the hard or easy axes, as illustrated in FIG. 4B.

Figure 4B:
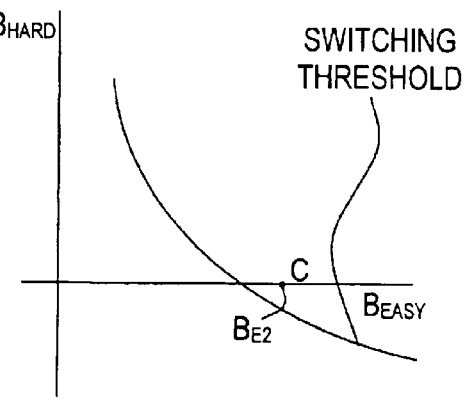
FIG. 4B illustrates an exemplary relationship between the axes of magnetic orientation of an exemplary memory element, where the hard axis is altered in accordance with embodiments of the invention.

Referring to FIG. 4B, the magnetization threshold may be altered in the direction of the hard axis $B_H$. Altering the hard axis may be accomplished in various ways, such as by rotating the magnetic memory element 215 with respect to the conductors 216 and 217. In these embodiments, inducing a magnetic field along the easy axis alone may be enough to cause the orientation of the magnetic layer to change. For example, as indicated in FIG. 4B, the easy axis field $B_{E2}$ at point C alone may be sufficient to overcome the magnetic threshold and cause the magnetic orientation of the magnetic layer to change.

Referring again to FIG. 3, the orientation of the magnetization of layer 215B may be adjusted to be parallel to the magnetization of layer 215A (i.e., arrows in the same direction), or anti-parallel to the magnetization of layer 215A (i.e., arrows in opposite directions). By varying the relative magnetic orientations (parallel or anti-parallel) of layers 215A and 215B, the electrical resistance of layer 215C may be varied. Digital values may be stored by associating the various electrical resistances of layer 215C with the digital values. Accordingly, the memory element 215 is sometimes referred to as a magneto-resistive tunnel junction (MTJ). For example, a voltage potential may be established across memory element 215, which may cause current carriers to "tunnel" through layer 215C. The electrical resistance to the flow of current may be characterized and associated with a digital value—e.g., 1 MΩ may be measured and associated with a digital 0, and 1.1 MΩ may be measured and associated with a digital 1.

In order to store data values to memory element 215, write lines 216 and 217 may be employed. The separation distance illustrated in FIG. 3 between the write lines 216 and 217 and the memory element 215 is exaggerated for clarity, and in accordance with embodiments of the invention the actual separation distance may be on the order of a few hundred angstroms or less. Alternative embodiments may comprise lines 216 and 217 in direct physical contact with memory element 215 with no dielectric separating the memory element 215 from either line 216 or 217. Circuitry (not illustrated in FIG. 3), may be electrically coupled to write lines 216 and 217 to provide electrical currents $I_1$ and $I_2$. Current $I_1$ in write line 216 may generate a magnetic field $B_1$, and likewise current $I_2$ in write line 217 may generate a magnetic field $B_2$. Magnetic fields $B_1$ and $B_2$ may then collectively contribute to the magnetic field induced in memory element 215, where the magnetic fields $B_1$ and $B_2$ may be adjusted by adjusting the strength and direction of currents $I_1$ and $I_2$. For example, reversing the direction of the currents $I_1$ and $I_2$ will reverse the orientation of the magnetic fields $B_1$ and $B_2$. Accordingly, the orientation of the magnetizations in layers 215A and 215B may be adjusted to be parallel or anti-parallel. As was mentioned above, the magnetic memory element 215 may be subject to adjusting the inherent magnetization, which may alter the memory element's switching characteristics, as is illustrated in FIG. 4B.

Figure 5:
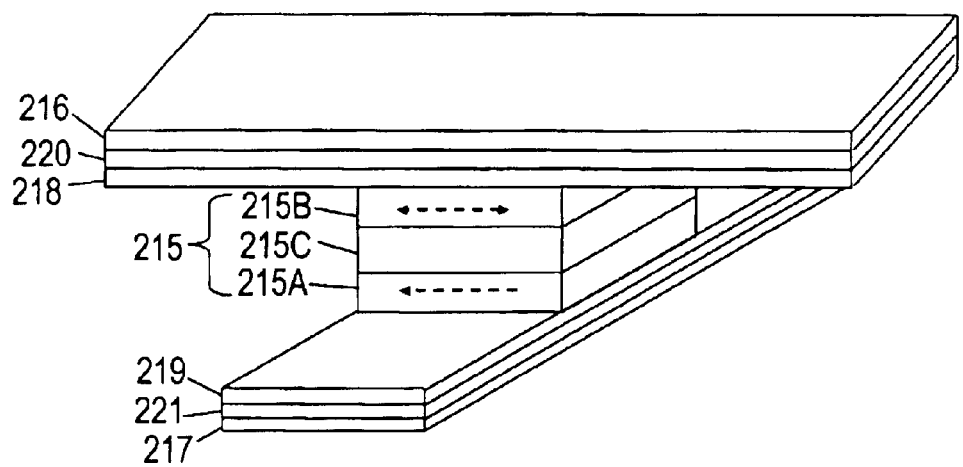
FIG. 5 illustrates an exemplary implementation of a magnetic memory element including read and write conductors in accordance with embodiments of the invention.

FIG. 5 illustrates the memory element 215 of FIG. 3 in greater detail and including read lines 218 and 219. In order to read data from a memory element, read lines 218 and 219 may be electrically coupled to the memory element as illustrated in FIG. 5. An inter-layer dielectric (ILD) 220 may electrically isolate write line 216 from read line 218. Likewise, ILD 221 may electrically isolate write line 217 from read line 219. While ILDs 220 and 221 are illustrated separating read and write lines in FIG. 5 subsequent figures may not show an ILD to separate read and write lines for the sake of clarity. It should be understood that an ILD may be included between any read and write conductor pair for electrical isolation. Additionally, although read line 218 and write line 216 are illustrated running in the same direction, this embodiment is not required; and read line 218 and write line 216 may be oriented in any direction with respect to each other. Similarly, read line 219 and write line 217 may also be oriented in any direction with respect to each other. Circuitry (not illustrated in FIG. 5) may be electrically coupled to read lines 218 and 219 in order to facilitate reading of memory element 215.

Figure 6:
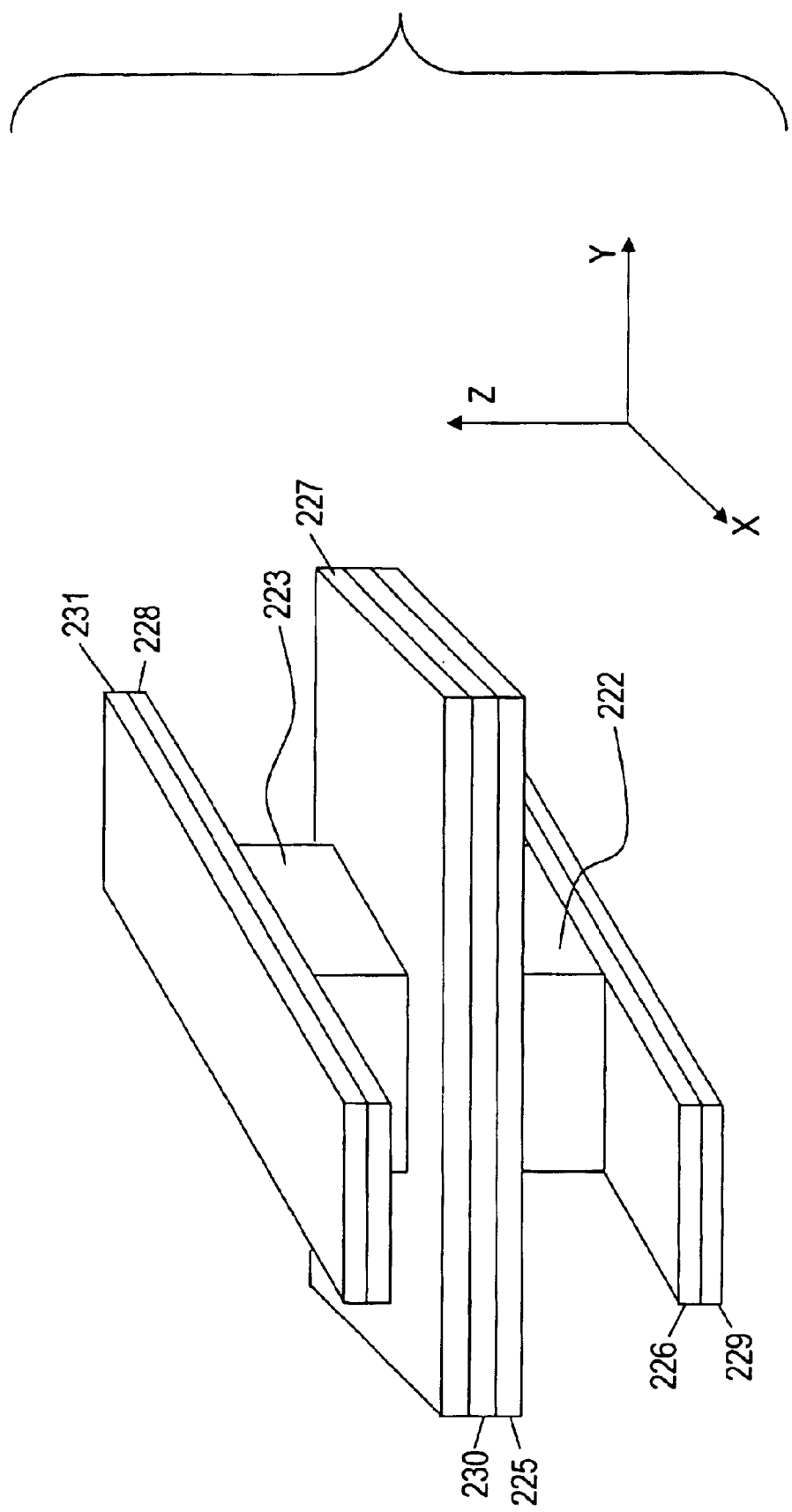
FIG. 6 illustrates an exemplary embodiment of magnetic memory elements arranged vertically in accordance with embodiments of the invention.

In accordance with embodiments of the invention, high density memory arrays may be integrated on the substrate adjacent to each other. FIG. 6 illustrates magnetic memory elements 222 and 223 that are substantially vertical to each other. Although FIG. 6 illustrates memory element 222 directly below memory element 223, there may be a lateral offset between the memory elements 222 and 223. Memory element 222 may be electrically coupled to read conductors 225 and 226. Read conductors 225 and 226 may be used to determine the digital state of memory element 222. Similarly, read conductors 227 and 228 may be coupled to magnetic memory element 223, and read conductors 227 and 228 may be used to determine the digital state of memory element 223.

Memory element 222 may be magnetically coupled to write conductors 229 and 230. Write conductors 229 and 230 may be used to adjust the magnetic orientation of memory element 222. Likewise, write conductors 230 and 231 may be magnetically coupled to memory element 223, and write conductors 230 and 231 may be used to adjust the magnetic orientation of memory element 223. By integrating the memory elements 222 and 223 on top of each other, common write conductors may be shared between the memory elements 222 and 223. For example, write conductor 230 may magnetically couple to both memory element 222 and memory element 223. In this manner, one or more conductors may be eliminated so that fewer processing steps may be required to manufacture the memory devices. In addition, inducing currents in the various conductors associated with magnetic memory elements consumes power, and therefore reducing the number of the conductors used to perform memory operations consequently may also reduce the amount of power consumed.

The easy axes of memory elements 222 and 223 may be configured in the Y direction and the hard axes may be configured in the X direction, where the X, Y, and Z directions are indicated in FIG. 6. In this configuration, currents that flow in write conductors 229 and 231 may contribute to the easy axis field, and currents that flow in the common write conductor 230 may contribute to the hard axis field. Thus, in changing the magnetic orientation of memory elements 222 and 223, a hard axis current may flow in conductor 230. The hard axis current alone will not be sufficient to change the magnetic orientation of memory elements 222 or memory element 223. This situation was depicted with regard to point A in FIG. 4A. In order to change the orientation of the memory elements, an easy axis current may be required in the memory element's easy axis write conductor. For example, with a hard axis current flowing in conductor 230, the magnetic orientation of the magnetization of memory element 222 may be changed by inducing an easy axis current in conductor 229. Also, with a hard axis current flowing in conductor 230, the orientation of the magnetization of memory element 223 may be changed by inducing an easy axis current in conductor 231. Therefore, memory elements 222 and 223 may independently have their magnetic orientations, and consequently their digital states, changed. Memory elements 222 and 223 may be written simultaneously by applying currents to conductors 230, 229, and 231. Therefore, two memory elements may be written using three currents, and the amount of energy utilized may therefore be reduced.

Alternatively, if the easy axes of memory elements 222 and 223 run in the X direction, then current in common write conductor 230 produces an easy axis field. Memory elements 222 and 223 may be written to simultaneously, for example, by inducing a current in the common write conductor 230 as well as conductors 229 and 231.

In addition, the easy or hard axes may be altered such that memory elements may be written to by applying only easy or hard axis current. For example, an alteration may be introduced in the memory elements such that the switching threshold illustrated in FIG. 4B applies. In these embodiments, the orientation of the memory elements may be changed by applying only easy axis fields, e.g., point A in FIG. 4B. Thus, referring back to FIG. 6, if the memory element 222 includes an altered magnetization threshold characteristic, then a current in write conductor 229 alone may allow the orientation of memory element 222 to be changed. Likewise, if memory element 223 includes an altered magnetization characteristic, current in write conductor 231 alone may be sufficient to change the orientation of memory element 223.

The common write conductor 230 may be used to selectively write data to memory elements 222 and 223. For example, the structure illustrated in FIG. 6 may be implemented in an array of memory elements where many memory elements are coupled to write conductor 230. Thus, if conductor 230 represents easy axis current, then all of the memory elements in the array that are magnetically coupled to write conductor 230 may be altered simultaneously by inducing a sufficient amount of current in common write conductor 230. For example, all the memory elements that are magnetically coupled to write conductor 230 may be written to 1. Subsequently, desired memory elements may be written to the opposite digital state by reducing the current in the common write conductor 230 (easy axis current) while inducing the appropriate current in the write conductor 229 and/or 231 (hard axis current). In this manner, memory element 222 and/or 223 may be selectively written to a desired digital state using three conductors, which may result in overall power savings.

The non-destructive read techniques disclosed in U.S. patent application Ser. No. 10/465,714, entitled "Retrieving Data Stored in a Magnetic Integrated Memory" which is incorporated herein by reference, may be implemented in the various embodiments disclosed herein. For example, referring to FIG. 6, read circuitry (not illustrated in FIG. 6) may monitor the resistance of memory element 222 via read conductors 225 and 226. Concurrently, current may flow in the common write conductor 230, which in this example, may induce a field along the hard axis of memory element 222. The magnetic field induced along the hard axis will not be sufficient to alter the magnetic orientation of the memory element 222. However, hard axis magnetic fields may be sufficient to temporarily perturb the resistance of memory elements as the magnetic field is turned on and off. By monitoring the rate of change of the resistance of memory element 222 as the current is switched, the orientation of the magnetization of memory element 222 may be determined. In addition, since conductor 230 may magnetically couple to both memory element 222 and memory element 223, conductor 230 may be used to determine the orientation of memory element 222 and memory element 223 simultaneously. Therefore, memory read time may be reduced as multiple memory elements may be read simultaneously.

The above discussion is meant to be illustrative of the principles and various embodiments of the present invention. Numerous variations and modifications will become apparent to those skilled in the art once the above disclosure is fully appreciated. For example, although magneto-resistive memory elements were disclosed in conjunction with some of the embodiments of the invention, other memory devices with variable resistances may be implemented without departing from the scope of this disclosure.

In addition, although FIG. 6 shows two memory elements substantially vertical to each other, additional stacking may be implemented. For example, multiple memory elements may be stacked substantially vertical with respect to each other, where magnetic conductors are sandwiched between the magnetic memory elements. In this manner, the sandwiched conductors may be used to adjust the magnetic state of the stacked magnetic memory elements. Furthermore, the configuration of the easy and hard axes may be configured in any direction, and the roles of the easy and hard axes as described herein, may be reversed. Additionally, memory elements that are vertically adjacent to each other may be written in opposite digital states using the common conductor. For example, the bottom memory element may be written low and the top memory element may be written high. In this manner, differential sensing techniques may be performed on both the top and bottom memory elements such that accuracy of the read operations may be increased. It is intended that the following claims be interpreted to embrace all such variations and modifications.

What is claimed is:

1. A memory, comprising:
   a first magnetic memory element;
   a first group of conductors magnetically coupled to the first magnetic memory element;
   a second magnetic memory element; and
   a second group of conductors magnetically coupled to the second magnetic memory element;
   wherein the first and second group of conductors have at least one conductor in common; and
   wherein a magnetic field is induced in the first and second memory elements using the common conductor, and wherein the induced field temporarily perturbs a resistance of the first and second memory elements.

2. The memory of claim 1, wherein the magnetic memory elements are capable of having their magnetic orientation adjusted by the common conductor.

3. The memory of claim 2, wherein power required to change magnetic orientation of the magnetic memory elements is dependant on the number of conductors, and wherein the number of conductors used for writing data to the memory elements us three or less.

4. The memory of claim 2, wherein the memory elements are written to a digital state by inducing current in the common conductor, and then the memory elements are selectively written to opposite digital states by inducing a current in the common conductor and inducing a current in a conductor that is not common to the memory elements.

5. The memory of claim 2, wherein the orientation of the magnetic memory elements are adjusted independently.

6. The memory of claim 1, wherein the magnetic memory elements further comprise hard axis magnetization thresholds that are altered.

7. The memory of claim 1, wherein the magnetic orientation of the memory elements are sensed while current flows in the common conductor.

8. The memory of claim 7, wherein read and write operations are performed simultaneously.

9. The memory of claim 1, wherein the common conductor is between the memory elements.

10. The memory of claim 1, wherein a digital state of each memory element is determined by monitoring a rate of change of the perturbed resistance.

11. The memory of claim 10, wherein the digital state is a current digital state stored in the memory element.

12. A method, comprising:
    monitoring a plurality of memory elements to measure a rate of change of resistance of the memory elements;
    providing a magnetic field to the memory elements using a conductor that is magnetically coupled to at least two memory elements; and
    determining a digital state by monitoring the memory elements while the magnetic field is perturbed.

13. The method of claim 12, wherein the original magnetic orientation of the memory elements is not changed by the provided magnetic field.

14. The method of claim 12, wherein the digital state is a current digital state stored in the memory element.

15. The method of claim 12, wherein a rate of change of the resistance indicates the digital state of the memory elements.

16. A computer, comprising:

a processor;

a bridge logic device coupled to said processor;

a memory coupled to the processor, comprising:

a plurality of magnetic memory elements; and a conductor magnetically coupled to the plurality of memory elements wherein a current digital state of at least one of the plurality of memory elements is determined by monitoring resistance of the at least one memory element while magnetic orientation of the at least one memory element orientation is perturbed.

17. The memory of claim 16, wherein the conductor provides independent control of the digital state of the memory elements.

18. A method, comprising:

providing a common conductor to a plurality of memory elements, wherein the common conductor magnetically couples to the memory elements;

inducing a magnetic field by flowing a current in the common conductor;

perturbing a digital state of the memory elements using the induced magnetic field; and monitoring a resistance of the memory elements while altering a digital state of the memory elements.

19. The method of claim 18, wherein a rate of change of the resistance indicates the digital state of the memory elements.

20. The method of claim 19, wherein perturbing the digital state does not change a magnetic orientation of the memory element.

21. A computer, comprising:

a processor;

a bridge logic device coupled to said processor;

a means for storing and retrieving information that is coupled to the processor, wherein the means for storing and retrieving information comprises:

a first magnetic memory element;

a second magnetic memory element arranged adjacent to the first magnetic memory elements; and a conductor coupled to both the first and second magnetic memory elements, wherein the conductor is adapted to switch a magnetic orientation of both the first and second magnetic memory elements while determining a current digital state of the first and second memory elements.

* * * * *